United States Patent
Kobayashi et al.

(10) Patent No.: US 12,436,456 B2
(45) Date of Patent: Oct. 7, 2025

(54) MOLDING APPARATUS, MOLDING METHOD, AND TEMPLATE

(71) Applicant: CANON KABUSHIKI KAISHA, Tokyo (JP)

(72) Inventors: Masatoshi Kobayashi, Tochigi (JP); Keiko Chiba, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 65 days.

(21) Appl. No.: 17/459,590

(22) Filed: Aug. 27, 2021

(65) Prior Publication Data

US 2022/0066316 A1   Mar. 3, 2022

(30) Foreign Application Priority Data

Sep. 1, 2020   (JP) .................. 2020-146878

(51) Int. Cl.
  *G03F 7/00*   (2006.01)
  *H01L 21/027*   (2006.01)

(52) U.S. Cl.
  CPC ........ *G03F 7/0002* (2013.01); *H01L 21/0271* (2013.01)

(58) Field of Classification Search
  CPC .................................................... G03F 7/0002
  See application file for complete search history.

(56) References Cited

U.S. PATENT DOCUMENTS

| | | |
|---|---|---|
| 8,541,053 B2 | 9/2013 | Menezes et al. |
| 9,063,409 B2 | 6/2015 | Khusnatdinov et al. |
| 2010/0012622 A1 * | 1/2010 | Panga ............... G03F 7/70483 216/52 |
| 2010/0109195 A1 | 5/2010 | Xu et al. |
| 2013/0084352 A1 * | 4/2013 | Suzuki ................. B29C 33/56 216/41 |
| 2017/0011505 A1 | 1/2017 | Valley |

FOREIGN PATENT DOCUMENTS

| | | | |
|---|---|---|---|
| JP | 2005039155 A | | 2/2005 |
| JP | 2010187002 A | | 8/2010 |
| JP | 2013211450 A | * | 10/2013 |
| JP | 2016523449 A | | 8/2016 |
| JP | 2019127039 A | | 8/2019 |
| JP | 2020061490 A | | 4/2020 |
| KR | 20110089337 A | | 8/2011 |
| KR | 20130071426 A | | 6/2013 |
| KR | 20160022825 A | | 3/2016 |
| KR | 20190090339 A | | 8/2019 |

OTHER PUBLICATIONS

Machine Translation of JP 2013211450 A, no date.*

* cited by examiner

*Primary Examiner* — Alex A Rolland
(74) *Attorney, Agent, or Firm* — Canon U.S.A., Inc. IP Division

(57) ABSTRACT

A molding apparatus including a template apparatus is configured to bring the template into contact with a curable composition arranged on a substrate and to cure the curable composition. The template includes a planarization coating layer of which a site front least squares range (SFQR) is 20 nm or less in a contact surface which is a surface of the template in contact with the curable composition.

11 Claims, 3 Drawing Sheets

MOLDING APPARATUS, MOLDING METHOD, AND TEMPLATE

BACKGROUND OF THE INVENTION

Field of the Invention

The present disclosure relates to a molding method and a molding apparatus which contribute to planarization of a substrate and a template used therein.

Description of the Related Art

Photolithography for manufacturing a semiconductor device requires a process for planarizing a substrate. According to the International Technology Roadmap for Semiconductors (ITRS), it is stated that a value of a site front least squares range (SFQR) is required to be equal to or less than a minimum line width with respect to flatness of a substrate. The SFQR is a parameter representing flatness of a wafer. The SFQR is defined as an amplitude of unevenness on a wafer surface from a mathematically calculated least squares plane in a predetermined site on the wafer surface (generally, a slit size of a scanner: 26*8 (mm$^2$)).

The most common planarization technique in semiconductor device manufacturing is chemical mechanical polishing (CMP). The CMP primarily developed for planarizing a hard material, such as a metal and a dielectric material, has some drawbacks. For example, in order to apply the CMP to a soft material, such as an organic compound, expensive and strict process control is required, which is difficult to put to practical use. There is also an issue that a dent due to polishing occurs in a concave portion wider than several μm. Extreme ultraviolet (EUV) exposure and nano-imprint are examples of the most advanced technology in a photolithography process for manufacturing the semiconductor device described above, and a pattern line width having the minimum line width of several tens of nm or less is required. Therefore, flatness of several tens of nm or less is required.

As the planarization technique other than the CMP, a technique using an imprint method is discussed in Japanese Patent Application Laid-Open No. 2019-127039. The technique is to cure a polymerizable imprint material (a curable composition) arranged between a first surface of a substrate which is required to be planarized and a template, separate (release) the template from the cured material, and thus form a cured film having a planar surface on the substrate. Ink-jet technology for ejecting (dispensing) a droplet of the imprint material to a desired position is used to apply the imprint material to the substrate. A pattern of droplets (a droplet pattern) to be ejected on the substrate is changed on demand depending on surface unevenness of the first surface. Thus, the substrate can obtain highly accurate planarity without being affected by fine unevenness of the substrate as compared with the CMP or the like in which a planarization process is uniformly performed regardless of the surface unevenness of the first surface.

In the planarization in the imprint method, planarity of a template contact surface to be directly brought into contact with the imprint material has a great influence on planarity of the substrate after molding.

However, even if planarity of the template is high, if mold releasability from the imprint material is poor, not only a large force is required to separate (release) the template but also the surface of the substrate or the surface of the template after releasing may be damaged. Accordingly, desired planarity may not be ensured in mass production.

SUMMARY OF THE INVENTION

The present disclosure is directed to the provision of a molding apparatus which molds a planar surface on a substrate with high productivity using a template with reduced mold releasing force while ensuring planarity.

A molding apparatus including a template is configured to bring the template into contact with a curable composition arranged on a substrate and to cure the curable composition. The template includes a planarization coating layer of which a site front least squares range (SFQR) is 20 nm or less in a contact surface which is a surface of the template in contact with the curable composition.

According to the present disclosure, a template which achieves a high degree of planarity while enabling mass productivity, and a molding apparatus and a molding method using the template can be provided.

Further features of the present disclosure will become apparent from the following description of exemplary embodiments with reference to the attached drawings.

DESCRIPTION OF THE EMBODIMENTS (Configuration of Molding Apparatus)

Figure 1:
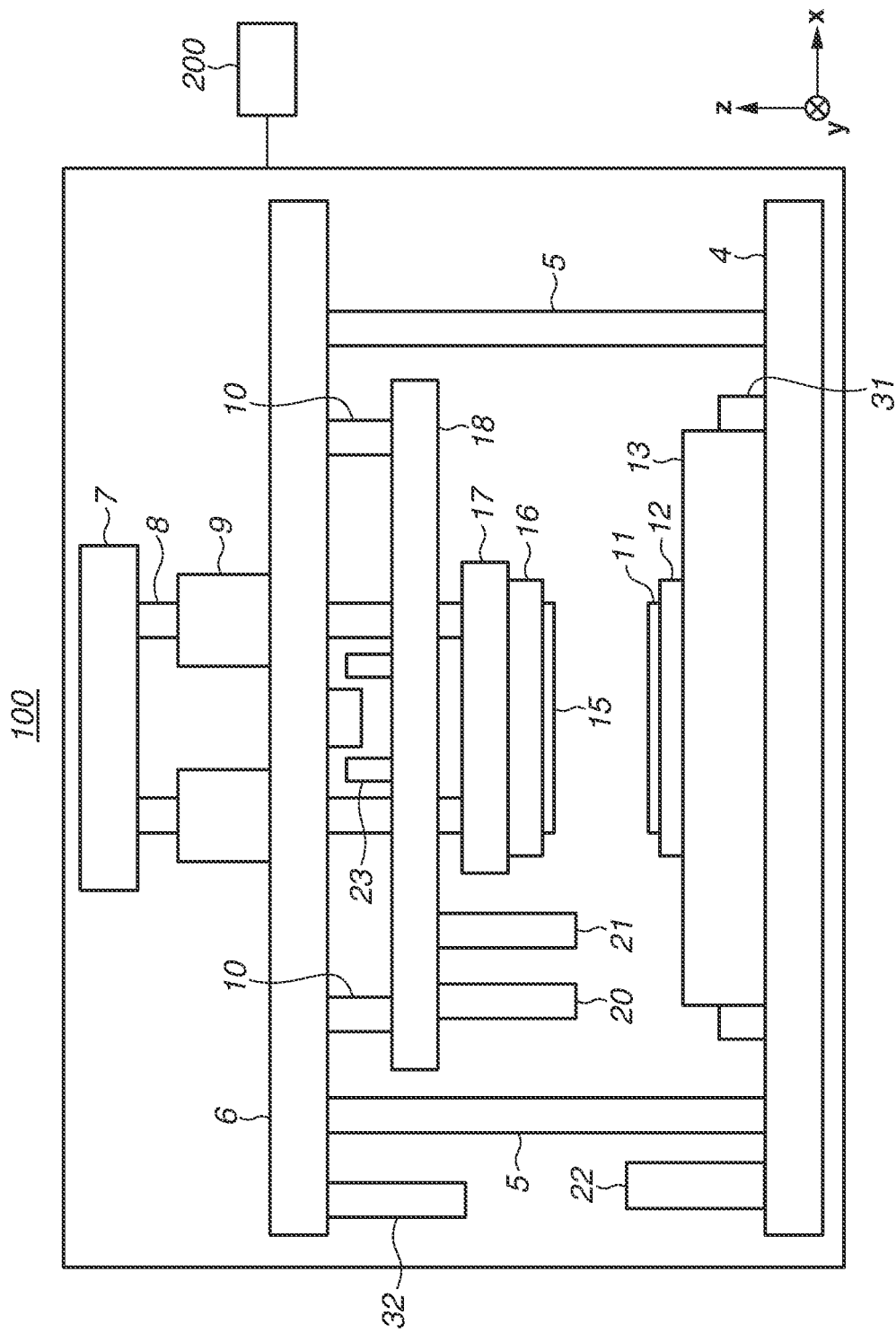
FIG. 1 is a schematic diagram illustrating a configuration of a molding apparatus.

FIG. 1 is a schematic diagram illustrating a configuration of a molding apparatus 100. The molding apparatus 100, which serves as a planarization apparatus, is embodied in a molding apparatus that molds a curable composition on a substrate 11 using a template 15 having a planar surface and, according to the present exemplary embodiment, planarizes the curable composition on the substrate 11.

The molding apparatus 100 cures the curable composition on the substrate 11 in a state in which the curable composition is in contact with the template 15 and separates the template 15 from the cured composition, thus broadly or locally forming a planar surface of the composition on the substrate 11.

A silicon wafer is a typical base material for the substrate 11, but the base material of the substrate 11 is not limited thereto. The substrate 11 can be freely selected from those known as substrates for semiconductor devices, such as aluminum, a titanium-tungsten alloy, an aluminum-silicon alloy, an aluminum-copper-silicon alloy, silicon oxide, and silicon nitride. As the substrate 11, a substrate may be used in which an adhesion layer is formed through surface treatment such as silane coupling treatment, silazane treatment, and formation of an organic thin film, and adhesion to the curable composition is improved. The substrate 11 is typically a circle having a diameter of 300 mm, but is not limited to this.

As the template 15, a template made of a light transmissive material can be used in consideration of a light irradiation process. Specific examples of a desirable material for the template 15 are glass, quartz, an optically transparent resin such as a polycarbonate resin, a transparent metal vapor-deposition film, a soft film made of polydimethylsiloxane or the like, a photocurable film, and a metal film. The template 15 is desirably a circle having a diameter more than 300 mm and less than 500 mm, but is not limited to this. A thickness of the template 15 is desirably 0.25 mm or more and less than 2 mm, but is not limited to this.

As the curable composition, ultraviolet (UV) curable liquid composition may be used in consideration of the light irradiation process. Typically, a monomer, such as acrylate and methacrylate, may be used.

The molding apparatus 100 includes a substrate chuck 12, a substrate stage 13, a base surface plate 4, pillars 5, a top plate 6, a guide bar plate 7, a guide bar 8, a template drive unit 9, pillars 10, a template chuck 16, a head 17, and an alignment rack 18. The molding apparatus 100 further includes a droplet supply unit 20, an off-axis alignment (OA) scope 21, a substrate conveyance unit 22, an alignment scope 23, a light source 24 (not ullustrated), a stage drive unit 31, a template conveyance unit 32, and a control unit 200.

The substrate chuck 12 and the substrate stage 13 form a substrate holding unit for holding the substrate 11, and the template chuck 16 and the head 17 form a template holding unit for holding the template 15. In FIG. 1, an XYZ coordinate system is defined so that a horizontal plane serves as an XY plane, and a vertical direction serves as a Z axis direction.

The substrate 11 to be subjected to a planarization processing is conveyed from the outside of the planarization apparatus 100, which is the molding apparatus 100, or a storage box in which a wafer is stored by the substrate conveyance unit 22 including a conveyance hand and is held by the substrate chuck 12. The substrate stage 13 is supported by the base surface plate 4 and is driven in the X axis direction and the Y axis direction to place the substrate 11 held by the substrate chuck 12 at a predetermined position.

The stage drive unit 31 includes, for example, a linear motor and an air cylinder and drives (moves) the substrate stage 13 at least in the X axis direction and the Y axis direction, but may have a function of driving the substrate stage 13 in two or more axis directions (for example, six axis directions). The stage drive unit 31 includes a rotation mechanism and rotationally drives (rotates) the substrate chuck 12 and the substrate stage 13 about an axis parallel to the Z axis direction.

The template 15 is conveyed from the outside of the molding apparatus 100 or a storage box in which the template is stored by the template conveyance unit 32 including a conveyance hand and is held by the template chuck 16. The template 15 has, for example, a circular or quadrangular outer shape and includes a planar portion on its lower surface. The planar portion has rigidity to come into contact with the curable composition on the substrate 11 to follow a surface shape of the substrate 11. The planar portion is equal to or greater than the substrate 11 in size.

The template chuck 16 is supported by the head 17 and has a function of correcting an inclination of the template 15 about the Z axis. Each of the template chuck 16 and the head 17 includes an opening for passing light (ultraviolet rays) emitted from the light source 24 via a collimator lens. A load cell for measuring a pressing force (an imprinting force) of the template 15 onto the curable composition on the substrate 11 is arranged on the template chuck 16 or the head 17. The template chuck 16 having such features can attract and hold the template 15, and, specifically, can use an electrostatic chuck mechanism which attracts and holds the template 15 by an electrostatic attractive force, a vacuum chuck mechanism which attracts and holds the template 15 by a vacuum suction force, and the like. According to the present exemplary embodiment, the electrostatic chuck mechanism will be described as an example.

The pillars 5 that support the top plate 6 is arranged on the base surface plate 4. The guide bar 8 penetrates through the top plate 6 and is fixed to the guide bar plate 7 on its one end and to the head 17 on the other end.

The template drive unit 9 is a mechanism for driving the head 17 in the Z axis direction via the guide bar 8 to bring the template 15 into contact with the curable composition on the substrate 11, and for separating the head 17 from the curable composition on the substrate. The template drive unit 9 has a function of driving (moving) the head 17 in the X axis direction and the Y axis direction, a function of rotationally driving the template chuck 16 or the head 17 about the axis parallel to the Z axis direction, and a function of rotating the template chuck 16 and the head 17 in the Y axis direction. In other words, the control unit 200 performs control so that a relative position between the template 15 held by the template chuck 16 and the substrate 11 held by the substrate chuck 12 is adjusted by the stage drive unit 31 and the template drive unit 9 in planarization processing.

The alignment rack 18 is suspended from the top plate 6 via the pillars 10. The guide bar 8 penetrates the alignment rack 18. A height measurement system (not illustrated) for measuring a height (planarity) of the substrate 11 held by the substrate chuck 12 using, for example, an oblique incident image shift method is arranged on the alignment rack 18.

The OA scope 21 is supported by the alignment rack 18. The OA scope 21 is used in global alignment processing in which an alignment mark provided to a plurality of shot areas on the substrate 11 is detected, and each position of the plurality of shot areas is determined.

The alignment scope 23 includes an optical system and an image capturing system that observe a reference mark provided to the substrate stage 13 and the alignment mark provided to the template 15. However, in a case where the template 15 is not provided with the alignment mark, the alignment scope 23 may not be provided. The alignment scope 23 is used for alignment for measuring a relative position between the reference mark provided to the substrate stage 13 and the alignment mark provided to the template 15 and correcting misalignment of the relative position. A positional relationship between the template 15 and the substrate stage 13 is determined by the alignment scope 23, a positional relationship between the substrate stage 13 and the substrate 11 is determined by the OA scope 21, and accordingly, relative alignment between the template 15 and the substrate 11 can be performed.

The droplet supply unit 20 includes a dispenser including an ejection port (a nozzle) for ejecting an uncured (liquid) curable composition to the substrate 11 and drops and arranges (supplies) a droplet of the curable composition on the substrate. The droplet supply unit 20 can adopt, for example, a piezo-jet method and a micro-solenoid method and supply a minute volume droplet curable composition to the substrate. The number of the ejection ports in the droplet supply unit 20 is not limited and may be one (a single nozzle) or may exceed 100. In other words, the ejection ports may be a linear nozzle array or a combination of a plurality of the linear nozzle arrays.

The control unit 200 includes a processing unit, such as a central processing unit (CPU), another processor, and a field-programmable gate array (FPGA), and a storage unit, such as a memory, and controls the entire molding apparatus 100. The control unit 200 functions as a processing unit which comprehensively controls each unit in the molding apparatus 100 to perform planarization processing. The planarization processing is planarizing the curable composition by bringing the planar surface of the template 15 into contact with the curable composition on the substrate 11 and making the planar surface follow the surface shape of the substrate 11. Generally, the planarization processing is performed in lot units, namely on each of a plurality of substrates included in the same lot.

(Processing Method for Planarization)

Next, an outline of generally performed planarization processing will be described with reference to FIGS. 2A to 2C. Here, processing will be described in which the curable composition is dropped on an entire surface of the substrate, and the curable composition is brought into contact with the template to planarize the curable composition. However, the curable composition may be planarized in such a manner that the curable composition on a partial area of the substrate is brought into contact with the template.

Figure 2A:
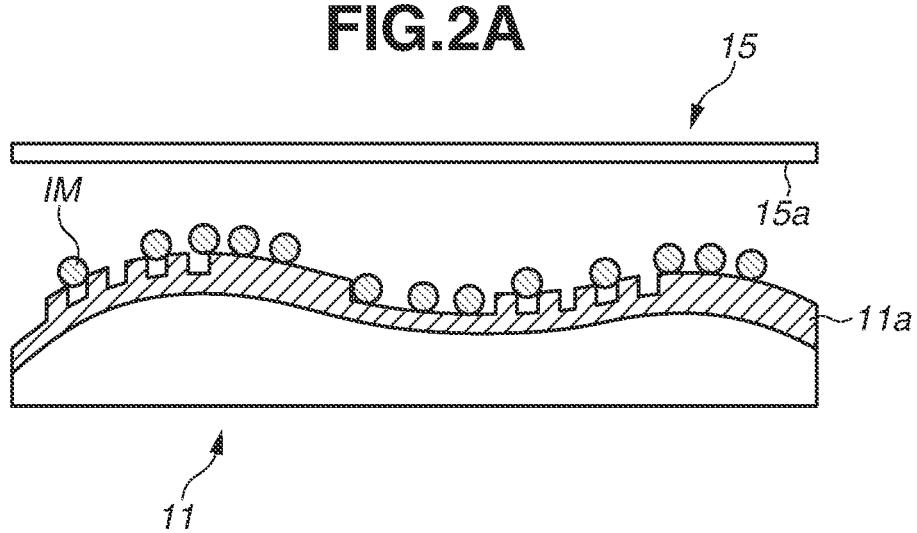
FIGS. 2A to 2C illustrate an outline of planarization processing.

First, as illustrated in FIG. 2A, a plurality of droplets of curable composition IM is dropped on demand from the droplet supply unit 20 onto the substrate 11 on which a base pattern 11a is formed. FIG. 2A illustrates a state in which the curable composition IM is supplied onto the substrate 11, and before the template 15 is brought into contact with the substrate 11. Next, as illustrated in FIG. 2B, the curable composition IM on the substrate 11 is brought into contact with a planar portion 15a of the template 15.

Figure 2B:
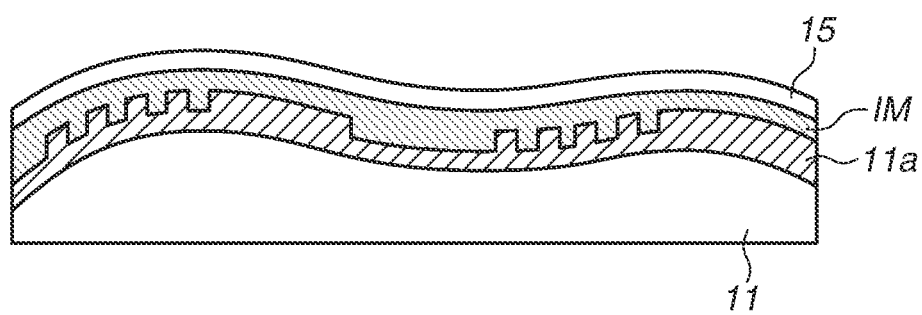

FIG. 2B illustrates a state in which the planar portion 15a of the template 15 is in contact with all the curable composition IM on the substrate 11, and the planar portion 15a of the template 15 follows the surface shape of the substrate 11. In the state illustrated in FIG. 2B, the curable composition IM on the substrate 11 is irradiated with light from the light source 24 via the template 15 and cured.

Figure 2C:
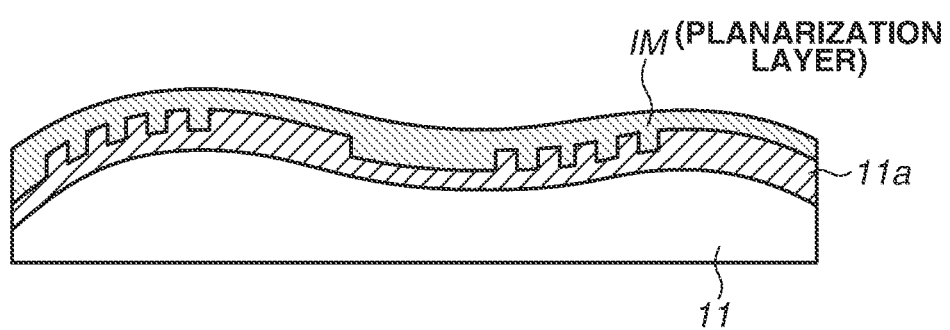

Next, as illustrated in FIG. 2C, the template 15 is separated from the cured curable composition IM on the substrate 11. Thus, a planarization layer of the curable composition IM having a uniform thickness is formed on the entire surface of the substrate 11. FIG. 2C illustrates a state in which the planarization layer of the curable composition IM is formed on the substrate 11. In a case where such planarization processing is performed, it is difficult to bring the template 15 having a large area into contact with the curable composition on the entire surface of the substrate 11 and then to separate the template 15 from the entire surface. A force required to separate the template 15 (a mold releasing force) is increased as a contact area becomes larger. If the mold releasing force is increased, there is a possibility that a mold releasing operation itself cannot be normally performed, a pattern formed on the substrate is damaged, and the curable composition on the substrate is not normally planarized.

As a result of an examination by the present inventors, it was found that it is possible to form a surface of which a site front least squares range (SFQR) value is 20 nm or less and to reduce the mold releasing force after curing by forming a planarization coating layer on a template surface to be brought into contact with the curable composition.

In particular, by using a fluorine resin typified by CYTOP (registered trademark) for the planarization coating layer, not only the template surface having the SFQR of 20 nm or less can be easily formed through application and the like, but also the mold releasing force at the time of separation can be significantly reduced even if the SFQR of a surface of a template base material is 20 nm or more. Accordingly, peeling from the substrate at the time of mold release can be effectively controlled, and the substrate surface reflecting planarity of the template can be stably molded.

The planarity of the template 15 is important, so that the SFQR value is to be 20 nm or less, and more desirably it is manufactured to satisfy 10 nm or less according to the present disclosure.

(Configuration of Template)

Figure 3:
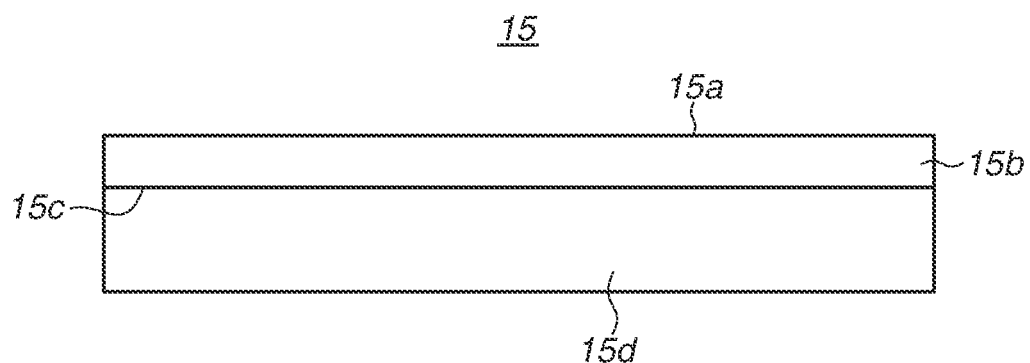
FIG. 3 is a sectional view of a part of a template in the molding apparatus in FIG. 1.

FIG. 3 is a schematic diagram illustrating a configuration of the template 15. The template 15 can include a template substrate 15d having a planar surface 15c. The surface 15c does not include a concave portion and a convex portion and can be referred to as blank. The surface 15c can have an area of at least 90% of the area of the substrate 11 and can have the area equal to or larger than that of the substrate 11. According to one exemplary embodiment, the area of the surface 15c is at least 280 cm$^2$, at least 700 cm$^2$, at least 1,100 cm$^2$, or larger than that. According to another exemplary embodiment, the area of the surface 15c can be a maximum of 31,500 cm$^2$.

The surface 15c can have a two-dimensional shape including a circle, an ellipse, a rectangle (including a square), and a hexagon. The SFQR of the surface 15c of the template substrate 15d, which can be improved with a protective layer 15b described below, is desirably equal to or less than a minimum line width in a next process after planarization. More specifically, the SFQR of the surface 15c is to be 20 nm or less and desirably 10 nm or less. Accurate measurement is difficult in an area too close to a peripheral edge portion, so that a measured value which excludes an area of 3 mm from an outer peripheral edge (edge exclusion) can be used.

The template substrate 15d has transmittance of at least 70%, at least 80%, at least 85%, or at least 90% with respect to radiation used for curing the curable composition. The template substrate 15d can include a glass based material, silicon, an organic polymer, a siloxane polymer, a fluorocarbon polymer, sapphire, spinel, other similar materials, or an optional combination of these materials. The glass based material can include soda-lime glass, borosilicate glass, alkaline barium silicate glass, aluminosilicate glass, quartz, and synthetic fused silica. The template substrate 15d can have a thickness in a range from 25 μm to 2000 μm.

The surface 15c of the template substrate 15d can be covered with the protective layer 15b as the planarization coating layer.

The protective layer 15b is formed on the template substrate 15d and has the planar portion 15a having the SFQR equal to or less than the minimum line width in the next process after planarization. Specifically, the SFQR of the planar portion 15a is 20 nm or less and desirably 10 nm or less. The SFQR can be determined using a thickness and profile measurement system. The SFQR is defined as an amplitude of unevenness on the substrate surface from a mathematically calculated least squares plane in a certain site of the substrate surface (generally, a slit size of a scanner: 26*8 (mm$^2$)).

The SFQR can be measured using the thickness and profile measurement system (LGW-3020FE, manufactured by KOBELCO RESEARCH INSTITUTE, INC.).

According to one exemplary embodiment, a representative amount of an area including the center can be used as a measured value. For example, for the substrate 11 having the diameter of 300 mm, a measured value of the SFQR of the planar portion 15a can be obtained at a certain position between the center and the edge exclusion area.

According to one exemplary embodiment, the SFQR may be a value with respect to a contact area of the planar portion 15a. In the contact area, the template 15 comes into contact with the curable composition IM during a contact operation. According to one exemplary embodiment, the SFQR of the planar portion 15a of the protective layer 15b is a maximum of the minimum line width in the next process after planarization, a maximum of 20 nm, a maximum of 10 nm, or a maximum of 4 nm.

The protective layer 15b is formed so as to improve the SFQR of the template substrate 15d as in an exemplary embodiment to be described below. A film thickness of the protective layer 15b is adjusted based on a measured value of the SFQR of the template substrate 15d. Even in a case where the surface 15c of the template substrate 15d satisfies a sufficient SFQR, the SFQR can be maintained or improved.

Further, the protective layer 15b has the planar portion 15a having a surface roughness Ra equal to or less than a surface roughness Ra of the surface 15c of the template substrate 15d. The surface roughness Ra can be determined using an atomic force microscope. Since the measured value is too close to the periphery, the edge exclusion of 3 mm can be used.

The surface roughness Ra can be a median value of the measured values. According to one exemplary embodiment, the representative amount of the area including the center can be used as the measured value. For example, for the substrate 11 having the diameter of 300 mm, a measured value of the surface roughness Ra of the protective layer 15b can be obtained at a certain position between the center and the edge exclusion area.

According to one exemplary embodiment, the surface roughness Ra may be a value with respect to the contact area of the planar portion 15a. In the contact area, the template 15 comes into contact with the curable composition IM during the contact operation. According to one exemplary embodiment, the surface roughness Ra of the planar portion 15a of the protective layer 15b is a maximum of 1 nm, a maximum of 0.5 nm, or a maximum of 0.2 nm. According to another exemplary embodiment, a threshold value is at least 0.1 nm.

The protective layer 15b helps to reduce a possibility that a particle is trapped between the template 15 and the substrate 11, and the surface 15c of the template substrate 15d is scratched by the particle. The protective layer 15b can be removed, and a new a protective layer can be formed on the surface 15c of the template substrate 15d. The protective layer 15b can help to extend a life of the template substrate 15d of the template 15.

According to one exemplary embodiment, the protective layer 15b is mainly made of an organic substance, such as polymethylmethacrylate (PMMA) and an amorphous fluorine resin. Further, the protective layer 15b can include transparent oxide, nitride, or oxynitride. According to a specific exemplary embodiment, the protective layer 15b may include silicon dioxide or aluminum oxide. The protective layer 15b can be formed by spin coating, chemical vapor deposition (plasma CVD or not), atomic layer deposition, and physical vapor deposition (e.g., sputtering).

According to another exemplary embodiment, the protective layer 15b has permeability to process gas. Permeability helps to remove gas. If the protective layer 15b does not have permeability, gas can be trapped in a case where the template 15 comes into contact with the curable composition. The protective layer 15b has higher permeability to the process gas that that of the template substrate 15d.

According to one exemplary embodiment, the process gas can be helium. According to one exemplary embodiment, the protective layer 15b can include a porous material. An exemplary porous material is discussed in U.S. Pat. Nos. 8,541,053 and 9,063,409, and their teachings regarding the porous material is incorporated in a disclosure of the present specification. The protective layer 15b can include a deposited oxide, anodized alumina, organic silane, an organic silicate material, an organic polymer, an inorganic polymer, or any combination of these materials.

A thickness of the protective layer 15b can be at least the same thickness of a particle which can be arranged between the substrate 11 on which the planarization layer is formed using the template 15 and the template 15. According to one exemplary embodiment, the thickness of the protective layer 15b can be at least 1 nm, at least 50 nm, or at least 200 nm. According to another exemplary embodiment, the thickness of the protective layer 15b can be a maximum of 10,000 nm, a maximum of 5,000 nm, a maximum of 3,000 nm, or a maximum of 950 nm.

The protective layer 15b can be treated with a release compound (release agent) to facilitate releasing of the template 15 from the planarization layer formed using the template 15. According to one exemplary embodiment, an exemplary release compound is discussed in United States Patent Application Publication No. 2010/0109195. Its teaching regarding the release compound is incorporated in the present specification by reference.

Regarding a template to be used in an imprint type planarization apparatus discussed in Japanese Patent Application Laid-Open No. 2019-127039, improvement of surface roughness using a protective layer is discussed, but planarity of the template substrate before forming the protective layer is even more important. The provision of a specific index enables preparation of the template substrate which is appropriately processed. Accordingly, the planarity can be further improved by adjusting the film thickness of the protective layer, and the surface roughness, which is a high-frequency component of roughness of the template, can be made further suitable.

The present disclosure is directed to improving mold releasability between an imprint material and a template by forming a protective layer with fluorine resin, which is a low surface energy material, and to providing a template that enables mass productivity and achieves a high degree of planarization, and a molding apparatus and a molding method using the template.

For the planarization coating layer, a fluorine resin, such as fluorinated polyimide, Teflon (registered trademark), CYTOP (registered trademark), fluoropolyarylether, fluorinated parylene, perfluorocyclobutane, and benzocyclobutene can be used. Among these materials, it is desirable to use CYTOP (registered trademark), which is an amorphous fluorine resin, as the planarization coating layer.

EXAMPLE

The present disclosure will be described in detail below with reference to examples.

First Example

A first example will be described with reference to FIG. 3.

As illustrated in FIG. 3, the template substrate 15d, which is a base material of the template 15, was made of quartz glass and had a thickness of 700 μm. The SFQR of the template substrate 15d measured by the thickness and profile measurement system (LGW-3020FE, manufactured by KOBELCO RESEARCH INSTITUTE, INC.) was 10 nm.

The protective layer 15b was formed with an amorphous fluorine resin (CYTOP) layer by spin coating. A median thickness of the CYTOP layer was 100 nm, and the SFQR of the planar portion 15a of the template 15 was improved to 7 nm by film thickness adjustment.

The molding apparatus 100 performed the processing illustrated in FIGS. 2A to 2C on the substrate 11 using the template 15, and the SFQR of the formed substrate surface became 7 nm. Accordingly, a minimum line width of 7 nm can be realized by an extreme ultraviolet (EUV) exposure apparatus in the next process.

Second Example

As in the first example, the template substrate 15d of the template 15 was made of quartz glass and had a thickness of 700 µm. The SFQR of the template substrate 15d was 20 nm.

The protective layer 15b was formed with a PMMA layer and an amorphous fluorine resin (CYTOP) layer by spin coating. The central values of the thicknesses of the PMMA layer and the CYTOP layer were respectively 1 µm and 100 nm, and the SFQR of the planar portion 15a of the template 15 could be maintained at 20 nm.

A value of the surface roughness Ra measured by an atomic force microscope (atomic force microscope Nanoscope manufactured by Bruker) was 0.2 nm. The molding apparatus 100 performed the processing illustrated in FIGS. 2A to 2C on the substrate 11 using the template 15, and the SFQR of the formed substrate surface became 20 nm. Accordingly, a minimum line width of 20 nm can be realized which is formed by a nano-imprint apparatus in the next process.

Comparative Example

The template substrate 15d in a comparative example were similar to that in the first example except that the SFQR of the template substrate 15d was 50 nm. The planarity after forming the protective layer 15b was slightly improved, but the SFQR thereof was 45 nm.

The molding apparatus 100 performed the processing illustrated in FIGS. 2A to 2C on the substrate 11 using the template 15, and thus the SFQR of the formed substrate surface became 45 nm.

A focal depth cannot be adjusted by the EUV exposure apparatus in the next process, so that the minimum line width of 7 nm cannot be realized.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-146878, filed Sep. 1, 2020, which is hereby incorporated by reference herein in its entirety.

What is claimed is:

1. A method of molding, the method comprising:
arranging a curable composition on a substrate having an uneven surface shape;
bringing a template into contact with the curable composition; and
curing the curable composition in a state of being in contact with the template,
wherein the template includes a planar surface portion which is blank and a planarization coating layer on the planar surface portion, the planarization coating layer having a planar portion which comes into contact with the curable composition,
wherein the planar portion of the planarization coating layer has an area having a site front least squares range (SFQR), as measured by a thickness and profile measurement system, of 20 nm or less in an area of at least 26 mm*8 mm, and
wherein the template is configured to follow the uneven surface shape of the substrate when the template is brought into contact with the curable composition on the substrate.

2. The method according to claim 1, wherein the planarization coating layer includes a fluorine resin.

3. The method according to claim 1, wherein a SFQR of the area of the planar portion of the planarization coating layer is 10 nm or less.

4. The method according to claim 1, wherein a surface roughness of the planar portion of the planarization coating layer is less than a surface roughness of a substrate of the template.

5. The method according to claim 1, wherein a SFQR of the area of the planar portion of the planarization coating layer is less than a SFQR of the planar surface portion of the template.

6. The method according to claim 1,
wherein, in the arranging, the curable composition is arranged on demand in accordance with surface unevenness of the substrate,
wherein the method further comprises:
bringing the template into contact with the curable composition on the substrate; and
curing the curable composition by light irradiation via the template, and
wherein the substrate is planarized.

7. The method according to claim 1, wherein a surface roughness of the planar portion of the planarization coating layer is 1 nm or less.

8. The method according to claim 1, wherein the planar surface portion of the template has an area that is at least 90% the area of the substrate.

9. The method according to claims 1, wherein a thickness of the template is 0.25 mm or more and less than 2 mm.

10. The method according to claim 1, wherein the planar portion of the planarization coating layer has an area having a site front least squares range (SFQR) of 10 nm or less in an area of at least 26 mm*8 mm.

11. The method according to claim 1, wherein the planarization coating layer is a protective layer having a thickness of at least 50 nm.

* * * * *